United States Patent
Lin et al.

(10) Patent No.: US 7,223,692 B2
(45) Date of Patent: May 29, 2007

(54) MULTI-LEVEL SEMICONDUCTOR DEVICE WITH CAPPING LAYER FOR IMPROVED ADHESION

(75) Inventors: Keng-Chu Lin, Ping-Tung (TW); Tien-I Bao, Hsin-Chu (TW); Syun-Ming Jang, Hsin-Chu (TW)

(73) Assignee: Taiwan Semiconductor Manufacturing Co., Ltd, Hsin-Chu (TW)

( * ) Notice: Subject to any disclaimer, the term of this patent is extended or adjusted under 35 U.S.C. 154(b) by 81 days.

(21) Appl. No.: 10/836,297

(22) Filed: Apr. 30, 2004

(65) Prior Publication Data
US 2005/0242430 A1    Nov. 3, 2005

(51) Int. Cl.
*H01L 21/447*   (2006.01)
*H01L 21/4763*  (2006.01)

(52) U.S. Cl. .................. 438/672; 438/618; 438/675
(58) Field of Classification Search ............. 438/618, 438/672, 675
See application file for complete search history.

(56) References Cited

U.S. PATENT DOCUMENTS

| | | | |
|---|---|---|---|
| 6,261,951 B1 * | 7/2001 | Buchwalter et al. | 438/644 |
| 6,358,832 B1 * | 3/2002 | Edelstein et al. | 438/612 |
| 6,913,992 B2 * | 7/2005 | Schmitt et al. | 438/628 |
| 6,939,797 B2 * | 9/2005 | Barth et al. | 438/628 |

* cited by examiner

*Primary Examiner*—Zandra V. Smith
*Assistant Examiner*—Pamela E Perkins
(74) *Attorney, Agent, or Firm*—Tung & Associates

(57) ABSTRACT

A multi-layer semiconductor device including copper interconnects with improved interlayer adhesion and a method for forming the same, the method including providing a semiconductor substrate comprising a dielectric insulating layer comprising copper containing interconnects the dielectric insulating layer and copper containing interconnects comprising an exposed surface; forming a first capping layer on the exposed surface; providing a treatment on the first capping layer to increase interface adhesion between the capping layer and the dielectric insulating layer; and, forming a second capping layer on the first capping layer.

20 Claims, 2 Drawing Sheets

MULTI-LEVEL SEMICONDUCTOR DEVICE WITH CAPPING LAYER FOR IMPROVED ADHESION

FIELD OF THE INVENTION

This invention generally relates to methods for forming semiconductor device integrated circuitry including copper interconnects and more particularly to a multi-level semiconductor device and method for forming the same including copper interconnects and a capping layer with improved adhesion to underlying dielectric layers thereby reducing line to line current leakage, increasing TDDB and improving copper electro-migration resistance.

BACKGROUND OF THE INVENTION

Copper metallization is increasingly being used for advanced semiconductor device integrated circuit fabrication including semiconductor features having sub-quarter micron linewidths and high aspect ratios to larger features such as bonding pads. Copper and its alloys have lower resistivity and better electromigration resistance compared to other metals such as, for example, aluminum. These characteristics are critical for achieving device reliability together with higher current densities and increased signal propagation speed. While several processing difficulties related to forming copper semiconductor features have been overcome, several problems remain, especially in the areas of line to line current leakage between copper interconnects, an increased tendency of copper to electro-migrate through low-K dielectric insulating layers, and dielectric breakdown of low-K dielectric insulating layers.

One problem affecting copper metallization is the tendency of copper to easily form oxides of copper, for example CuO or $CuO_2$, upon exposure to oxidizing environments including humid environments. According to prior art processes, following the copper CMP process the exposed copper is protected by depositing overlying capping layers which may also function as an etch stop layer in formation of an overlying level of copper interconnects. For example, to form the next level of the device, a metal nitride layer which functions as an etching stop layer in formation of metal interconnect features such as vias or dual damascenes in overlying dielectric insulating layers, is typically deposited over the exposed copper following a CMP process. The overlying etching stop layer is also intended to act to prevent further copper oxidation and to reduce electro-migration of copper.

The dual goals of preventing copper electro-migration and preventing cross-interconnect current leakage have not been adequately solved for several reasons. For example, porous silicon oxide based low-K dielectric insulating layers having an interconnecting porous structure have exhibited reduced adhesion to overlying layers, for example etch stop layers, and have increased the tendency of integrated circuit damascene features, such as copper interconnects, to exhibit increased current leakage and electro-migration of copper ions. For example, a phenomenon known as time dependent dielectric breakdown (TDDB) is believed to result from charge accumulation due to slow current leakage over time along micro-cracks developed along poorly adhering material interfaces, for example poor adhesion of an overlying etch stop (capping) layer to an underlying inter-metal dielectric (IMD) layer. As a result, electrical performance and device reliability of semiconductor devices is compromised.

Thus, there is a continuing need for novel semiconductor integrated circuit manufacturing methods to improve the electrical performance of copper interconnect features including methods to improve adhesion of overlying capping layers.

It is therefore an object of the invention to provide a method for forming a copper interconnect capping layer to improve the electrical performance of copper interconnect features including methods to improve adhesion, in addition to overcoming other shortcomings of the prior art.

SUMMARY OF THE INVENTION

To achieve the foregoing and other objects, and in accordance with the purposes of the present invention, as embodied and broadly described herein, the present invention provides a multi-layer semiconductor device including copper interconnects with improved interlayer adhesion and a method for forming the same.

In a first embodiment, the method includes providing a semiconductor substrate comprising a dielectric insulating layer comprising copper containing interconnects the dielectric insulating layer and copper containing interconnects comprising an exposed surface; forming a first capping layer on the exposed surface; providing a treatment on the first capping layer to increase interface adhesion between the capping layer and the dielectric insulating layer; and, forming a second capping layer on the first capping layer.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained with reference to formation of an exemplary copper interconnect structure (feature) such as a trench line or via, it will be appreciated that the process may be equally as well used in forming copper dual damascene structures as well as thicker and wider structures such as bonding pads and wide trenches. The method is particularly advantageously used in the formation of copper damascene features such as vias and trench lines with linewidths/diameters less than about 0.25 microns, more preferably less than about 0.13 microns. In addition, the method is particularly advantageously used with silicon oxide based low-K dielectric insulating layers having an interconnecting porous structure and having a dielectric constant of less than about 3.0 including less than about 2.5, for example from about 2.2 to about 3.0. It will be understood that the method of the present invention is applicable to the formation of other features having exposed copper surfaces where an overlying nitride or carbide layer is subsequently deposited overlying the exposed copper. Further, the term 'copper' will be understood to include copper and alloys thereof.

For example, in an exemplary embodiment, referring to FIGS. 1A–1E, are shown cross sectional views of a portion of a multi-level semiconductor device at stages in a copper interconnect manufacturing process.

Figure 1A:
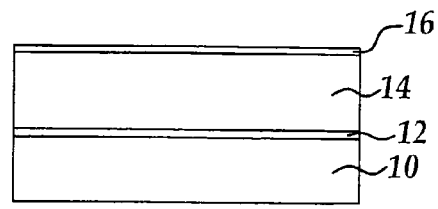
FIGS. 1A to 1E are cross-sectional views of a portion of a multi-layer semiconductor device at stages in a manufacturing process according to an exemplary embodiment of the present invention.

Referring to FIG. 1A, a dielectric insulating layer 10, for example an inter-metal dielectric (IMD) layer, is formed by conventional processes known in the micro-electronic integrated circuit manufacturing art, followed by deposition of an overlying first etching stop layer 12, for example, silicon nitride (e.g., SiN, $Si_3N_4$), silicon oxynitride (e.g., SiON), silicon carbide (e.g., SiC) or silicon oxycarbide (e.g., SiOC), more preferably SiN or SiC to a thickness of about 300 Angstroms to about 700 Angstroms by a conventional CVD process, for example, an LPCVD, PECVD, or HDP-CVD process. It will be appreciated that the etching stop layer 12 may be formed in the same manner as explained below for etching stop (capping) layer 24 including underlying treated glue layer 22. The dielectric layer 10 may include a copper filled conductive region e.g., a via (not shown) electrically interconnecting IMD layer levels in a multilevel semiconductor device.

Still referring to FIG. 1A, formed over first etching stop layer 12 is dielectric insulating (e.g., IMD) layer 14, preferably formed of a silicon oxide based low-K material, for example having an interconnecting porous structure, preferably carbon doped oxide or organo-silane glass (OSG). The IMD layer 14 preferably has a dielectric constant of less than about 3.0, preferably less than about 2.5. For example, the overall pore volume of the dielectric insulating layer may be from about 20% to about 60% pore volume with respect to any selected IMD layer volume portion. It will be appreciated that the dielectric constant may vary through the dielectric layer thickness. For example, a PECVD process using organo-silane and/or organo-siloxane precursors is carried out by known methods to produce the IMD layer 14.

It will additionally be appreciated that a second etch stop layer (not shown) similar to etch stop player 12, may be provided overlying the first IMD layer e.g., 14 (not shown) followed by deposition of a second IMD layer (not shown) in the same manner as the first IMD layer e.g., 14, in order to form a trench line opening overlying one or more via openings to form a dual damascene by known processes. The IMD layer 14 in the exemplary copper damascene formation embodiment is formed having a thickness of about 3000 to about 8000 Angstroms.

Still referring to FIG. 1A, a bottom anti-reflectance coating (BARC) layer 16, for example silicon oxynitride is provided over the IMD layer 14 at a thickness corresponding to odd increments of a quarter wavelengths of a subsequent photolithographic exposure process to minimize light reflectance from the IMD layer 14 surface.

Figure 1B:
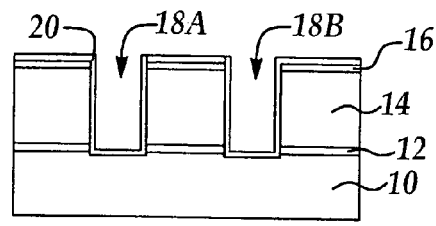

Referring to FIG. 1B, interconnect (e.g., trench) openings e.g., 18A and 18B are formed by a conventional photolithographic patterning and reactive ion etch (RIE) process. The interconnect openings e.g., 18A and 18B may be formed in closed communication with an underlying conductive region, e.g., vias or trenches (not shown). The interconnect openings e.g., 18A and 18B are then lined with a barrier layer e.g., 20 by a blanket deposition process such as a PVD and/or CVD process, the barrier layer preferably including at least one layer of a refractory metal, refractory metal nitride or silicided refractory hietal nitride for example Ti, Ta, TiN, TaN, Ti/TiN, Ta/TaN, TiSiN, or TaSiN, most preferably tantalum nitride (TaN). The barrier layer 20 is typically formed at a thickness of about 100 Angatroms to about 300 Angstroms.

Figure 1C:
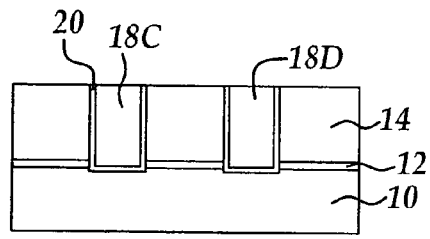

Referring to FIG. 1C, a conventional electrochemical deposition (ECD) process is then carried out to fill interconnect openings e.g., 18A and 18B with a blanket deposited copper layer to subsequently form planarized copper filled interconnects 18C and 18D. The ECD copper deposition process is preceded by deposition of a copper seed layer (not shown) by conventional processes, for example a PVD process. The copper portion overlying the interconnect opening level is then removed (planarized) by a conventional chemical mechanical polish (CMP) process including removing the barrier layer e.g., 20 and the BARC layer 16 to expose the IMD layer 14. The exposed IMD layer 14 is then optionally subjected to an oxide buffing process as part of the CMP process.

Figure 1D:
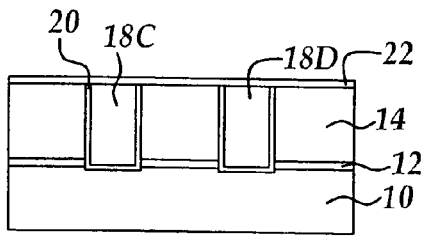

Referring to FIG. 1D, a glue (first capping layer) layer 22 having a thickness of about 50 Angstroms to about 500 Angstroms is then blanket deposited over the process surface including the copper interconnects 18C and 18D and the IMD layer 14. The glue layer 22 may be the same (same atomic components) or different material as a subsequently deposited overlying capping layer (etch stop) layer 24 shown below, for example comprising silicon oxide, silicon nitride (e.g., SiN), silicon oxynitride (e.g., SiON), silicon carbide (e.g., SiC), or silicon oxycarbide (e.g., SiOC) deposited by a CVD process such as PECVD or LPCVD. For example, if the glue layer 22 is formed of silicon oxide, preferably the glue layer is formed of low-K silicon oxide based material using organo-silane or organo-siloxane precursors, e.g., the same material as the IMD layer 14 and may be deposited by a spin-on process, but is more preferably deposited by a CVD process such as PECVD or LPCVD.

In critical aspect of the invention, the glue layer 22 is then treated with a plasma and/or an electron beam. In one embodiment, the plasma treatment is carried out with a hydrogen containing plasma source gas, e.g., free of oxygen, for example, plasma source gases such as $H_2$ and $NH_3$, or mixtures thereof, most preferably $H_2$. In another embodiment, plasma source gas may consist essentially of helium or may include helium with the hydrogen containing plasma gas source to assist in plasma formation. Exemplary plasma treatment conditions include a pressure of from about 0.5 Torr to about 10 Torr, a plasma power of 50 to about 200 Watts with an RF or DC bias of from about 0 to about 900 Watts. The plasma source gas or gases are preferably supplied at a gas flow rate of about 100 to about 2500 sccm. The plasma treatment is preferably carried out for a period of up to about 100 seconds.

The plasma treatment process is preferably carried out with a conventional PECVD or HDP-CVD tool (reactor), preferably including a decoupled bias source to alter a wafer bias power, including providing zero bias power. However, the plasma treatment process may also be carried out in any dry plasma reactor including a barrel plasma etcher, parallel plate reactor, downstream etcher, and high density plasma reactors including electron cyclotron resonance reactors, and magnetron reactors. The pressure of the plasma treatment may vary depending on the reactor used within a range of plasma pressures from about 1 mTorr to about 10 Torr, but is preferably carried out in a PECVD reactor within a range of about 1 Torr to about 10 Torr, more preferably between about 2 Torr to about 8 Torr. The glue layer plasma treatment may be carried out at a temperature from about 0° C. to about 400° C., more preferably about 100° C. to about 400° C., most preferably from about 325° C. to about 375° C.

In another embodiment, the glue layer 22 is treated with an electron beam (E-beam), for example where an E-beam is rastered in a controlled manner over the surface of the process wafer with the E-beam contacting the uppermost glue layer. Preferably the E-beam is provided at an accelerating Voltage of about 1000 to about 8000 eV with an electron flux at the process surface producing an electrical charge of about 50 to about 500 micro-coulombs/cm$^2$.

Figure 1E:
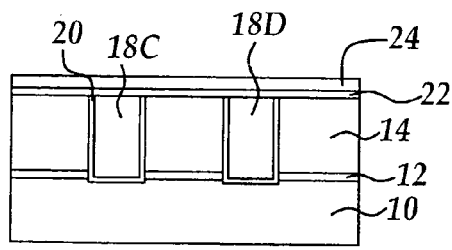

Referring to FIG. 1E, following deposition and treatment of the glue (first capping) layer 22, a second capping layer (e.g., etch stop layer) 24, is deposited over the glue layer to a thickness of about 300 Angstroms to about 1000 Angstroms. Preferably, the capping layer 24 is formed of silicon oxide, silicon nitride (e.g., SiN), silicon oxynitride (e.g., SiON), silicon carbide (e.g., SiC), or silicon oxycarbide (e.g., SiOC), and be formed of the same or different material as the glue layer 22, for example using a CVD process e.g., PECVD or LPCVD.

Advantageously, it has been found that formation and treatment of the glue layer 22 by plasma treatment or E-beam treatment serves to improve an adhesion of the glue layer to the underlying IMD layer 14, as well as to the exposed copper interconnect and additionally improves adhesion of the overlying capping layer 24 to the glue layer 22. It is believed that organic substituents (e.g., Si—CH$_3$ bonds) remaining from the organo-silane or organo-silane precursors in forming the IMD layer 14, or organic substituents remaining in the glue layer have the Si—CH$_3$ bonds broken to form Si—O bonds to increase the number of Si—O bonds per unit volume in the glue layer during the plasma treatment or E-beam treatment, thereby improving an interlayer (e.g., glue-layer/IMD layer) bonding adhesion. For example at least a portion of the treated glue layer including the entire glue layer will have an increased number of Si—O bonds compared to the untreated glue layer and compared to either the overlying capping layer or underlying IMD layer depending on the material the glue layer is formed of.

For example, the glue layer 22 provides a strengthened bonding transition between the IMD layer 14 and/or the subsequently deposited overlying capping layer 24 following either the plasma treatment or the E-beam treatment. The plasma or E-beam treatment is carried out according to preferred embodiments to avoid damaging the exposed copper interconnect, including reducing oxides present on the copper surface, and provides increased bonding strength of the glue layer to the IMD layer as evidenced by XPS Si—O bonding energy measurements at the IMD layer/glue layer interface. In addition, line to line current leakage e.g., between copper interconnects 18C and 18D has been demonstratively reduced and time dependent dielectric breakdown (TDDB) failure probability has been reduced compared to prior art capping (etch stop) layer formation processes.

For example, representative data measuring a current leakage contribution in conventional I-V measurements of copper interconnects formed in IMD layers according to preferred embodiments forming a portion of a multi-level semiconductor device has shown that regardless of the type of glue layer and capping layer combination formed according to preferred embodiments, that the line to line current leakage is reduced from about 1 to about 3 orders of magnitude.

Figure 2:
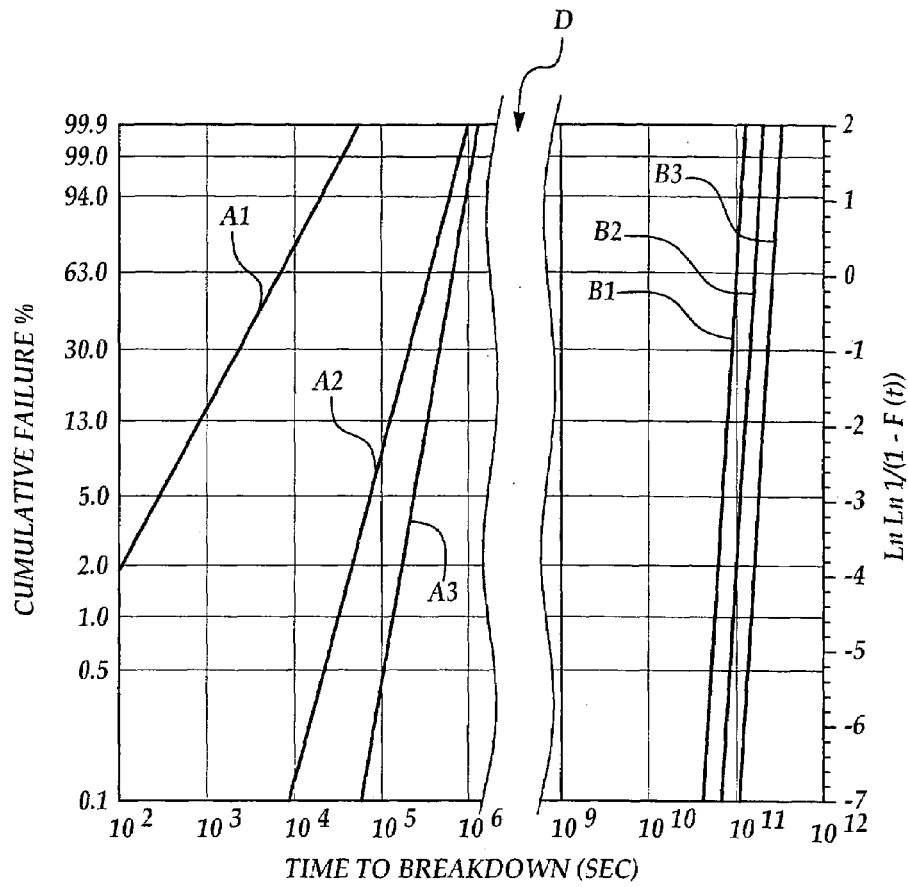
FIG. 2 is a graphical data representation of a Weibull distribution failure plot versus time representing TDDB failure under an applied electric field carried out on an integrated circuit with copper interconnects formed according to preferred embodiments of the present invention contrasted with prior art copper interconnects.

Referring to FIG. 2 is shown representative data depicting a Weibull distribution profile for time dependent dielectric breakdown (TDDB) of an IMD layer including copper interconnects with a capping layer formed according to preferred embodiments contrasted with capping layers formed without an inter-layer glue layer treatment according to preferred embodiments. Shown on the vertical axis is cumulative failure percent and on the horizontal axis a time to dielectric breakdown including a discontinuous portion e.g., D to show the dramatic improvement on one plot. The experimental conditions include a temperature of 125° C. and an applied electric filed of 2 MV/cm. Lines A1, A2, and A3 represent the failure probability of IMD layers having capping layers formed according to prior art methods, while lines B1, B2, and B3 represent the same respective capping layers formed including first forming a glue layer and treating with a plasma or E-beam according to preferred embodiments. It is seen that the time to dielectric breakdown is improved by several orders of magnitude when the capping layer is formed including the treated glue layer according to preferred embodiments.

Figure 3:
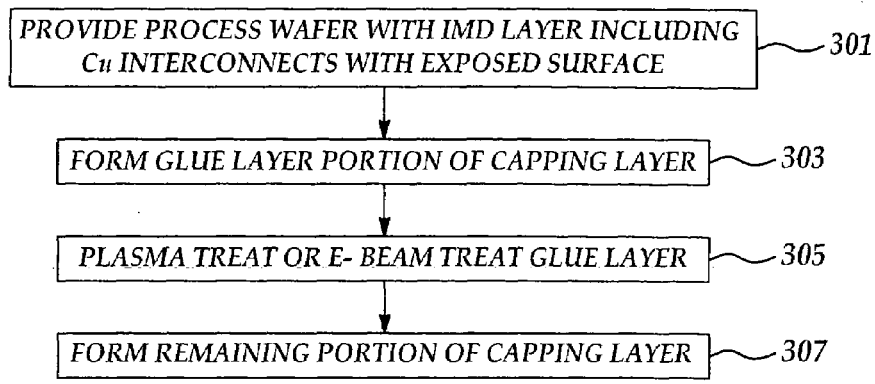
FIG. 3 is a process flow diagram according including several embodiments of the present invention.

Referring to FIG. 3 is a process flow diagram including several embodiments of the present invention. In process 301, a process wafer including an uppermost IMD layer including copper interconnects is provided having exposed upper surfaces. In process 303, a glue layer (first portion of capping layer) is formed over the IMD layer and copper interconnects according to preferred embodiments. In process 305, the glue layer is treated according to one of a plasma treatment and an E-beam treatment according to preferred embodiments. In process 307, a remaining portion of the capping layer is deposited according to preferred embodiments.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for forming a capping layer over a low-K dielectric insulating layer comprising copper containing interconnects to improve inter-layer adhesion comprising the steps of:
  providing a semiconductor wafer comprising a low-K dielectric insulating layer comprising copper containing interconnects the low-K dielectric insulating layer and copper containing interconnects comprising an exposed surface;
  forming a glue layer on the exposed surface; said glue layer consists essentially of silicon oxide formed of precursors selected from the group consisting of organo-silane and organo-siloxane precursors;
  treating the glue layer with an energy source selected from the group consisting of a plasma and an electron beam to increase the number of Si—O bonds per unit volume in a portion of of the glue layer; and,
  forming a capping layer on the glue layer.

2. The method of claim 1, wherein the glue layer is selected from the group consisting of silicon oxide, silicon nitride, silicon oxynitride, silicon carbide, and silicon oxycarbide.

3. The method of claim 1, wherein the capping layer is selected from the group consisting of silicon oxide, silicon nitride, silicon oxynitride, silicon carbide, and silicon oxycarbide.

4. The method of claim 1, wherein the capping layer comprises the same atomic components as the glue layer.

5. The method of claim 1, wherein the plasma consists essentially of a hydrogen containing plasma.

6. The method of claim 5, wherein the hydrogen containing plasma comprises source gases selected from the group consisting of $H_2$ and $NH_3$.

7. The method of claim 5, wherein the hydrogen containing plasma consists essentially of a plasma source gases selected from the group consisting $H_2$, $NH_3$, $N_2$ and Ar.

8. The method of claim 5, wherein the hydrogen containing plasma treatment comprises a pressure of from about 0.5 Torr to about 10 Torr.

9. The method of claim 1, wherein the electron beam is supplied at an accelerating Voltage of about 1000 eV to about 8000 eV.

10. The method of claim 1, wherein the step of treating is carried out at a temperature of from about 100° C. to about 400° C.

11. The method of claim 1, wherein the glue layer is formed at a thickness of from about 10 Angstroms to about 500 Angstroms.

12. The method of claim 1, wherein the capping layer is formed at a thickness of from about 50 Angstroms to about 1000 Angstroms.

13. The method of claim 1, wherein the low-K dielectric insulating layer is formed of one of organo-silane and organo-siloxane precursors to have a dielectric constant of less than about 4.0.

14. A method for forming a capping layer over a dielectric insulating layer comprising copper containing interconnects comprising the steps of:
   providing a semiconductor substrate comprising a dielectric insulating layer comprising copper containing interconnects, the dielectric insulating layer and copper containing interconnects comprising an exposed surface;
   forming a first capping layer comprising silicon oxide formed of precursors selected from the group consisting of organo-silane and organo-siloxane precursors on the exposed surface;
   providing a treatment on the first capping layer to increase interface adhesion between the capping layer and the dielectric insulating layer; and,
   forming a second capping layer on the first capping layer.

15. The method of claim 14, wherein said treatment comprises an energy source selected from the group consisting of a plasma and an electron beam.

16. The method of claim 14, wherein the second capping layer is selected from the group consisting of silicon oxide, silicon nitride, silicon oxynitricie, silicon carbide, and silicon oxycarbide.

17. The method of claim 14, wherein the treatment comprises a hydrogen containing plasma treatment.

18. The method of claim 17, wherein the hydrogen containing plasma treatment comprises plasma source gases selected from the group consisting of $H_2$ and $NH_3$.

19. The method of claim 17, wherein the hydrogen containing plasma treatment consists essentially of plasma source gases selected from the group consisting $H_2$, $NH_3$, He, $N_2$ and Ar.

20. The method of claim 17, wherein the treatment increases the number of Si—O bonds per unit volume in at least a portion of the first capping layer or dielectric insulating layer.

* * * * *